US012334712B2

(12) United States Patent
Yamaguchi

(10) Patent No.: US 12,334,712 B2
(45) Date of Patent: Jun. 17, 2025

(54) OPTICAL SEMICONDUCTOR INTEGRATED ELEMENT AND METHOD OF MANUFACTURING OPTICAL SEMICONDUCTOR INTEGRATED ELEMENT

(71) Applicant: Mitsubishi Electric Corporation, Tokyo (JP)

(72) Inventor: Tsutomu Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 848 days.

(21) Appl. No.: 17/600,811

(22) PCT Filed: Jun. 11, 2019

(86) PCT No.: PCT/JP2019/023014
§ 371 (c)(1),
(2) Date: Oct. 1, 2021

(87) PCT Pub. No.: WO2020/250291
PCT Pub. Date: Dec. 17, 2020

(65) Prior Publication Data
US 2022/0200242 A1   Jun. 23, 2022

(51) Int. Cl.
*H01S 5/22*   (2006.01)
*H01S 5/026*   (2006.01)
*H01S 5/343*   (2006.01)

(52) U.S. Cl.
CPC .............. *H01S 5/22* (2013.01); *H01S 5/0262* (2013.01); *H01S 5/0264* (2013.01); *H01S 5/0265* (2013.01); *H01S 5/34313* (2013.01)

(58) Field of Classification Search
CPC .................................................. H01S 5/0262
See application file for complete search history.

(56) References Cited

U.S. PATENT DOCUMENTS

2005/0070113 A1*  3/2005  Hanberg ........... H01L 21/28587
                                                                      438/706
2005/0259708 A1*  11/2005  Park ....................... H01S 5/026
                                                                     372/50.21
(Continued)

FOREIGN PATENT DOCUMENTS

JP       2000114642 A   *  4/2000
JP       2005-333144 A      12/2005
(Continued)

OTHER PUBLICATIONS

English Translation of Kasukawa (Year: 2000).*
(Continued)

*Primary Examiner* — Minsun O Harvey
*Assistant Examiner* — Stephen Sutton Kotter
(74) *Attorney, Agent, or Firm* — Studebaker Brackett PLLC

(57) ABSTRACT

An optical semiconductor integrated element comprises a laser section and a photodetector section which are arranged on the same semiconductor substrate, the laser section and the photodetector section each have a light confining layer which confines light, a cladding layer, and a contact layer formed of an InGaAs layer or an InGaAsP layer, the light confining layer of the laser section is an active layer, the contact layer of the photodetector section is a light absorption layer, each cladding layer is a ridge structure having a shape in which a width at a side of the light confining layer is narrower than a width at a side of the contact layer in a cross-section which is perpendicular to the optical axis, and on a side surface of the light confining layer, the cladding layer and the contact layer, a semiconductor embedded layer is not provided.

10 Claims, 24 Drawing Sheets

(56) References Cited

U.S. PATENT DOCUMENTS

| | | | |
|---|---|---|---|
| 2007/0071050 A1* | 3/2007 | Kuramoto | H01S 5/026 |
| | | | 372/43.01 |
| 2019/0036293 A1* | 1/2019 | Kobayashi | H01S 5/026 |
| 2019/0296523 A1 | 9/2019 | Yamaguchi | |

FOREIGN PATENT DOCUMENTS

| | | | |
|---|---|---|---|
| JP | 2007-149937 A | 6/2007 | |
| WO | 2018/109857 A1 | 6/2018 | |
| WO | WO-2018109982 A1 * | 6/2018 | H01S 5/12 |

OTHER PUBLICATIONS

English Translation of Yamaguchi (Year: 2018).*
International Search Report issued in PCT/JP2019/023014; mailed Sep. 10, 2019.
Office Action issued in TW 109118774; mailed by the Taiwan Intellectual Property Office on Jan. 26, 2021.

* cited by examiner

A-A CROSS SECTION

B-B CROSS SECTION

C-C CROSS SECTION

A-A CROSS SECTION

B-B CROSS SECTION

C-C CROSS SECTION

A-A CROSS SECTION

B-B CROSS SECTION

C-C CROSS SECTION

B-B CROSS SECTION

OPTICAL SEMICONDUCTOR INTEGRATED ELEMENT AND METHOD OF MANUFACTURING OPTICAL SEMICONDUCTOR INTEGRATED ELEMENT

TECHNICAL FIELD

This application relates to an optical semiconductor integrated element in which a semiconductor laser and a photodetector are integrated.

BACKGROUND ART

Regarding semiconductor lasers for optical communication, in a case where a semiconductor photodetector which monitors optical output (monitor PD) is integrated in a semiconductor laser, some configurations, in which a semiconductor photodetector is arranged in a top part of waveguide which waveguides a laser so as to be integrated, are proposed.

Regarding configurations of the above mentioned devices, all of them have a structure having an embedded layer in which an active layer of a semiconductor laser or a core layer of a waveguide is embedded, and, an InGaAs layer or an InGaAsP layer of a crystal growth layer as a contact layer which is grown on the embedded layer is used as a light absorption layer in a photodetector section (refer to Patent Document 1).

However, surface morphology of an embedded layer is not ideally flat, and has some protrusions having a size of several microns due to re-growth interface, therefore a contact layer, which is grown using the above mentioned surface condition as a substrate, has a region containing stacking defects (anti-phase domain) which are crystal defects, consequently, in an InGaAs layer or an InGaAsP layer which is used as a light absorption layer, crystal defects exist, as a result, photo detecting character and reliability may be deteriorated.

PRIOR ART DOCUMENT

Patent Document

Patent Document 1: JP 2005-333144A

SUMMARY OF THE INVENTION

Problems to be Solved by the Invention

As above mentioned, regarding an optical semiconductor integrated element in which a photodetector and a laser are integrated, in a case where the optical semiconductor integrated element has an embedded layer, there is a problem such that due to crystal defects in a light absorption layer, photo detecting character of photodetector is deteriorated.

This application aims to obtain an optical semiconductor integrated element in which a semiconductor photodetector (monitor PD) in which an InGaAs layer or an InGaAsP layer which is used as a contact layer in a semiconductor laser section is used as a light absorption layer is integrated, and the optical semiconductor integrated element has suppressed stacking defects (anti-phase domain) in a light absorption layer and less deterioration of photo detecting character.

Means for Solving Problems

An optical semiconductor integrated element which is disclosed by this application comprises a laser section which constitutes a semiconductor element and a photodetector section which constitutes a photodetector, the laser section and the photodetector are arranged on the same semiconductor substrate and along an optical axis of a laser, the laser section and the photodetector section have, in order from the side closest to the semiconductor substrate, a light confining layer which confines light, a cladding layer, and a contact layer formed of an InGaAs layer or an InGaAsP layer, the light confining layer of the laser section is an active layer, the contact layer of the photodetector section is a light absorption layer, each cladding layer has a ridge structure having a shape in which a width at a side of the light confining layer is narrower than a width at a side of the contact layer in a cross section perpendicular to the optical axis, and on a side surface of the light confining layer, the cladding layer and the contact layer, a semiconductor embedded layer is not provided.

Effects of Invention

According to an optical semiconductor integrated element which is disclosed by this application, an optical semiconductor integrated element, whose photo detecting character of a photodetector is less deteriorated, can be obtained.

MODE FOR CARRYING OUT THE INVENTION

Embodiment 1

Figure 1:
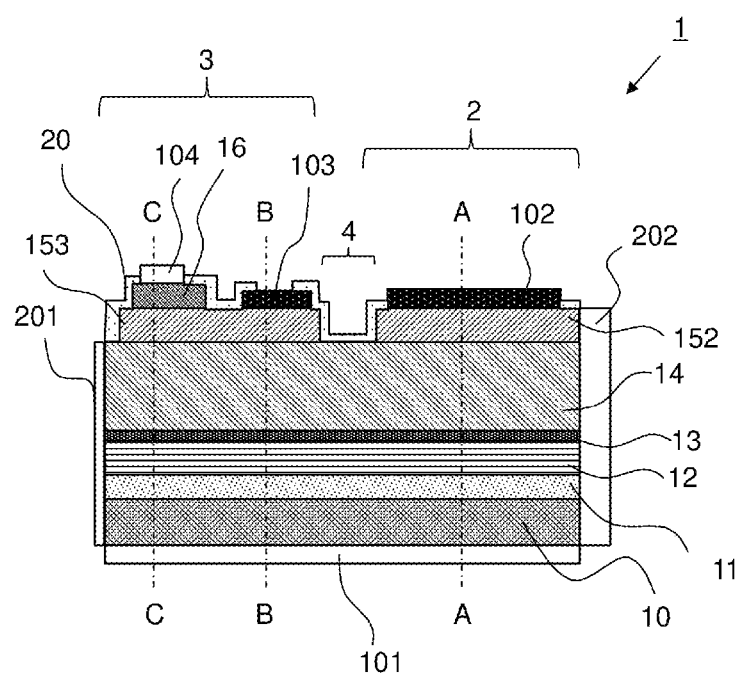
FIG. 1 is a cross section in a waveguide center showing the structure of an optical semiconductor integrated element according to Embodiment 1.
Figure 2:
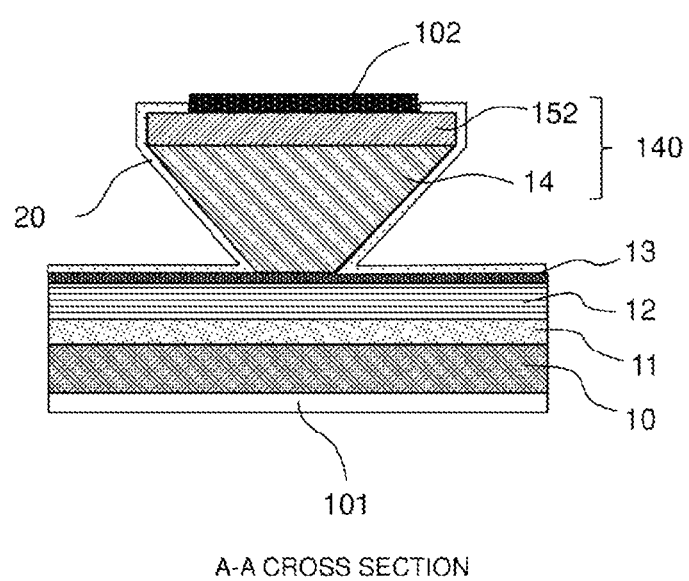
FIG. 2 is a cross section taken on line A-A of FIG. 1 of an optical semiconductor integrated element according to Embodiment 1.
Figure 3:
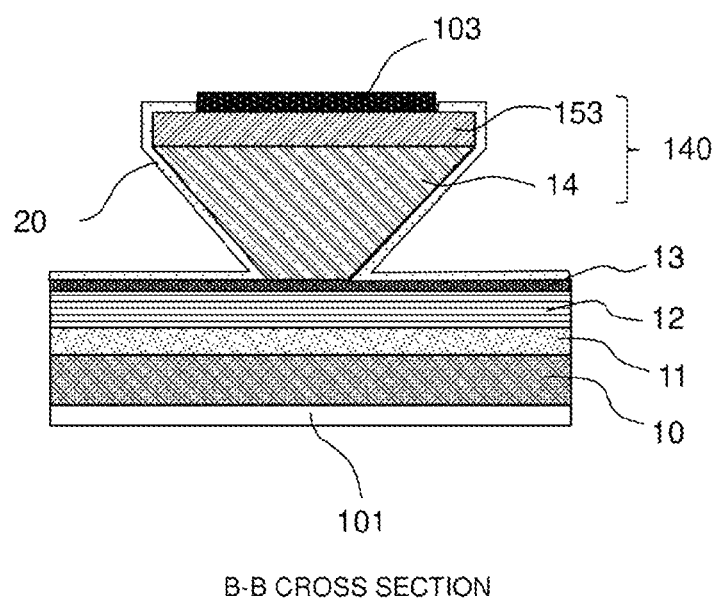
FIG. 3 is a cross section taken on line B-B of FIG. 1 of an optical semiconductor integrated element according to Embodiment 1.
Figure 4:
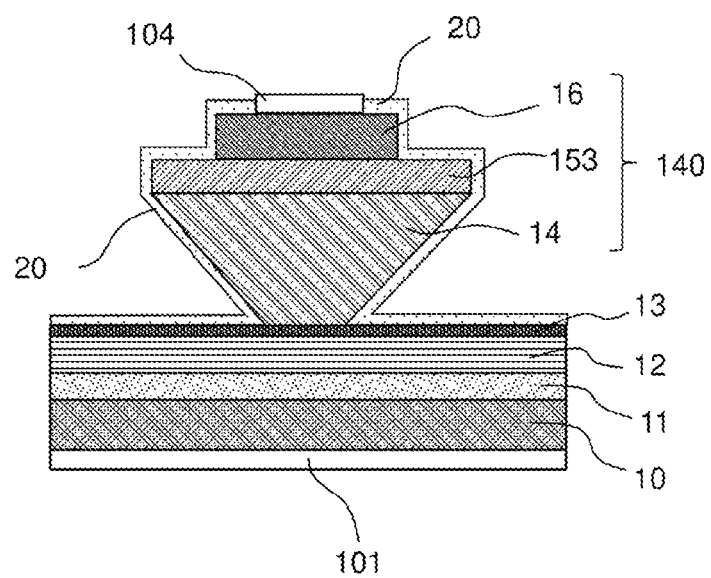
FIG. 4 is a cross section taken on line C-C of FIG. 1 of an optical semiconductor integrated element according to Embodiment 1.

FIG. 1 is a cross section showing the structure of an optical semiconductor integrated element according to Embodiment 1 in a cross section in a waveguide center which is parallel to an optical axis direction which is a direction where light propagates and which is perpendicular to a semiconductor substrate 10. FIG. 2 is a cross section taken on line A-A of FIG. 1, FIG. 3 is a cross section taken on line B-B of FIG. 1 and FIG. 4 is a cross section taken on line C-C of FIG. 1. This optical semiconductor integrated element 1 has the structure in which a laser section 2 which consists of a semiconductor laser and a photodetector section 3 which consists of a photodetector are integrated. Both of the laser section 2 and the photodetector section 3 have a common n-InP substrate 10 (hereinafter, in some cases, will be referred simply as a semiconductor substrate 10) and have the structure in which semiconductor layers, etc. are layered on the n-InP substrate 10. Further, regarding figures of this application, in order to make each part of figures clearly recognizable, it is described such that sizes of thickness, length and width of a substrate and other layers are different from actual size ratio.

On the n-InP substrate 10, an active layer 12 as a light confining layer is formed via an n-InP buffer layer 11 which is inserted in order to adjust refractive index and carrier density of the n-InP substrate 10 and the active layer 12. Regarding the active layer 12, for example, in a case where the laser section 2 is DFB laser, a diffraction grating is accompanied. Further, in some cases, regarding the photodetector section 3, a diffraction grating is accompanied. On the active layer 12, an etching stopper layer 13 is formed so as not for the active layer 12 to be etched in an etching process. A p-InP cladding layer 14 is formed so as to sandwich the etching stopper layer 13. On the p-InP cladding layer 14, as a contact layer, a p-InGaAs layer is formed, the contact layer is separated between a p-InGaAs contact layer 152 of the laser section 2 and a p-InGaAs contact layer 153 of the photodetector section 3, and a separating part, which is formed between the p-InGaAs contact layer 152 and the p-InGaAs contact layer 153, functions as an electric isolation part 4. On the p-InGaAs contact layer 152 of the laser section 2, a p-InP electrode 102 is formed. On the p-InGaAs contact layer 153 of the photodetector section 3, an n-InP contact layer (photodetector section contact layer) 16 and a p-InP electrode 103 are formed, and on the n-InP contact layer 16, an n-InP electrode 104 is formed. Further, on a back surface of the n-InP substrate 10, an n-InP electrode 101 is formed.

As shown in FIG. 1, on an edge surface where laser light in an optical axis direction is taken out, a front edge surface reflection coat film 201 is formed, and on another edge surface, a back edge surface reflection coat film 202 is formed so as to constitute a laser resonator. As shown in each cross section of FIG. 2, FIG. 3 and FIG. 4, regarding width of the p-InP cladding layer 14, a side of lower part, that is, a side of the active layer 12 is narrower, and a side of top, that is, a side of the p-InGaAs contact layer 152 or 153 is wider. As above mentioned, a so-called inverted mesa shape is made, that is, whole of a part which is upper than the active layer 12 (containing the etching stopper layer 13) has a so-called ridge structure. A side surface and an upper surface of a ridge structure part 140 including the electric isolation part 4 is covered with an insulating film 20 so as for at least one part of each of the p-InP electrode 102, the p-InP electrode 103 and the n-InP electrode 104 to be exposed. The etching stopper layer 13 in which the ridge structure part 140 is not formed is covered with the insulating film 20. As shown in each cross section of FIG. 2, FIG. 3 and FIG. 4, a side surface of the active layer 12, the p-InP cladding layer 14 and the p-InGaAs contact layers 152 and 153 do not have a semiconductor embedded layer, and regarding a lateral direction of cross section of each cross section of FIG. 2, FIG. 3 and FIG. 4, a structure in which light and electric current is confined by the ridge structure part 140 is formed.

In the laser section 2, by flowing electric currents between the p-InP electrode 102 and the n-InP electrode 101, electrons and holes are recombined in the active layer 12 so as to emit light, as a result, laser oscillation is generated. In the photodetector section 3, the p-InGaAs contact layer 153 is a light absorption layer and in a part between the p-InP electrode 103 and the n-InP electrode 104, a photodiode is formed, and light which is absorbed by the p-InGaAs contact layer 153 which is a light absorption layer can be detected, therefore, the photodetector section 3 can be used for monitoring laser light.

The optical semiconductor integrated element according to Embodiment 1 as shown in FIG. 1, FIG. 2, FIG. 3 and FIG. 4 is configured by so-called ridge structure, and a side surface from the active layer 12 to the ridge structure part 140 is not embedded with a semiconductor embedded layer. A surface morphology of a semiconductor embedded layer is not ideally flat and has some protrusions having size of several-micron which are caused by a re-growth interface, therefore a contact layer which is grown using the above mentioned surface state as a substrate has a region containing stacking defects (anti-phase domain) which are crystal defects. However, the optical semiconductor integrated element according to Embodiment 1 does not have a semiconductor embedded layer, therefore the contact layer does not contain a crystal defect which is caused by an embedded layer. Consequently, the p-InGaAs contact layer 153 which is used as a light absorption layer in the photodetector section 3 which is integrated does not have crystal defects, as a result, deterioration of photo detecting character and decline of reliability of the element can be suppressed.

Further, a side surface from the active layer 12 to the p-InP cladding layer 14 is not embedded with a semiconductor embedded layer so as to form a ridge structure, therefore, refractive index of a semiconductor layer in the ridge structure part 140 is significantly larger than that of an insulating film or air layer, and in comparison with a structure which has an embedded layer, a degree of light confinement is high. Regarding the photodetector section 3, securing sufficient light absorption amount is important, and when whole of element which is integrated has a ridge structure, a degree of light confinement in the ridge structure part 140 in the photodetector section 3 is high, therefore photo detecting amount which is received by the photodetector section 3 can be sufficiently secured, as a result, monitoring is easy. Further, regarding the ridge structure part 140, width of an upper part where a contact layer including a light absorption layer is arranged is large, therefore, the ridge structure part 140 has an inverted mesa shape, as a result, light absorption amount can be sufficiently obtained.

Further, a case in which a contact layer is formed of an InGaAs layer is descried, however, a contact layer may be an InGaAsP layer. Further, a structure, in which the laser section 2 is at a back edge surface side and the photodetector section 3 is at a front edge surface side, that is, laser light is taken out from a side where the photodetector section 3 is arranged, is described, however, the position relationship may be reverse. That is, a structure, in which the laser section 2 is arranged at a front edge surface side and the photodetector section 3 is arranged at a back edge surface side, is acceptable.

Embodiment 2

Figure 5:
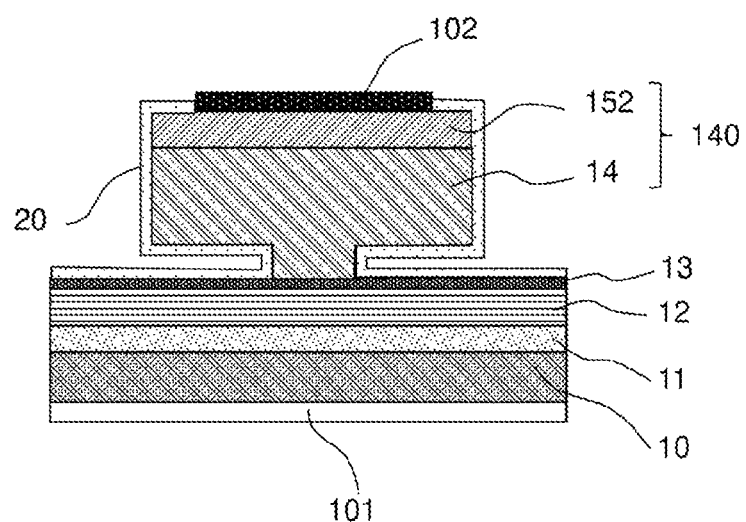
FIG. 5 is a cross section taken on line A-A of FIG. 1 of an optical semiconductor integrated element according to Embodiment 2.
Figure 6:
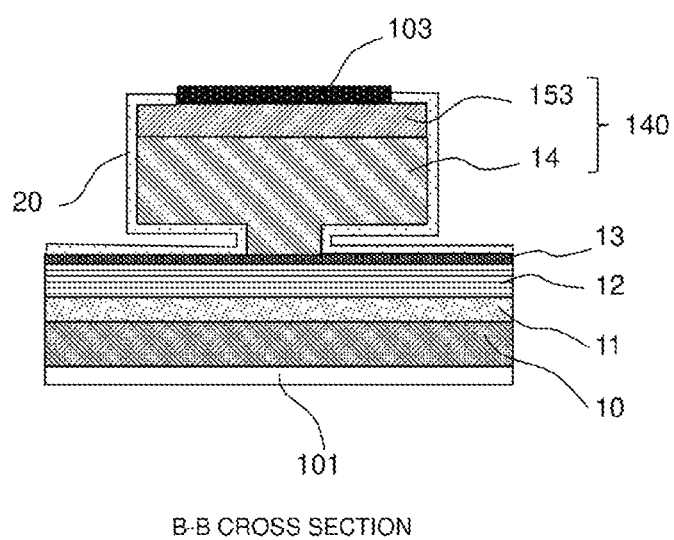
FIG. 6 is a cross section taken on line B-B of FIG. 1 of an optical semiconductor integrated element according to Embodiment 2.
Figure 7:
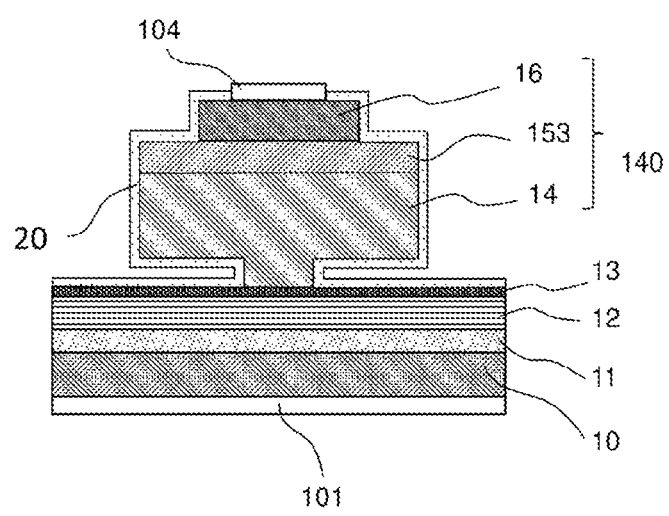
FIG. 7 is a cross section taken on line C-C of FIG. 1 of an optical semiconductor integrated element according to Embodiment 2.

A structure of an optical semiconductor integrated element according to Embodiment 2 in a cross section in a waveguide center along an optical axis is same as that shown in FIG. 1. FIG. 5 is a cross section showing a structure of an optical semiconductor integrated element according to Embodiment 2 taken on line A-A of FIG. 1, FIG. 6 is a cross section taken on line B-B of FIG. 1 and FIG. 7 is a cross section taken on line C-C of FIG. 1. In Embodiment 1, a cross section shape of a ridge structure part is an inverted mesa shape, however, in Embodiment 2, as shown in FIG. 5, FIG. 6 and FIG. 7, a cross section shape of a ridge structure part 140 is T-shaped. In FIG. 5, FIG. 6 and FIG. 7, a character which is same as that in FIG. 1, FIG. 2, FIG. 3 and FIG. 4 shows a same part or a corresponding part, and hereinafter, only a part which is different from that in Embodiment 1 will be described.

In Embodiment 2, regarding a p-InP cladding layer 14 which constitutes a ridge structure part 140, width at a side of an active layer 12 is narrower, and width of an upper part, which is a side opposite to the active layer 12 is larger, that is, the ridge structure part is so-called T-shaped which has two different widths. As above mentioned, regarding a shape of the ridge structure part 140, it is not necessary to be an inverted mesa shape which is inverted trapezoid shown in Embodiment 1, and any shape is acceptable when width of an upper part which is a side opposite to the active layer 12 is larger and width at a side of the active layer 12 is narrower than that of an upper part. However, an inverted mesa shape shown in Embodiment 1 or T-shaped shown in Embodiment 2 can be formed by etching, for example, therefore the ridge structure part 140 can be manufactured by performing simple manufacturing process.

As above mentioned, an optical semiconductor integrated element according to Embodiment 2 as shown in FIG. 5, FIG. 6 and FIG. 7 has a structure, that is, a ridge structure which is same as that of the optical semiconductor integrated element according to Embodiment 1, therefore a side surface from the active layer 12 to the ridge structure part 140 is not embedded with a semiconductor embedded layer. Consequently, a contact layer does not contain a crystal defect which is caused by an embedded layer, therefore, the p-InGaAs layer 153 which is used as a light absorption layer of the photodetector section 3 which is integrated does not have a crystal defect, as a result, deterioration of photo detecting character and decline of reliability of the element can be suppressed.

Further, a side surface from the active layer 12 to the p-InP cladding layer 14 is not embedded with a semiconductor embedded layer and is formed to be a ridge structure, therefore, refractive index of a semiconductor layer in the ridge structure part 140 is significantly larger than that of an insulating film or air layer, and in comparison with a structure which has an embedded layer, a degree of light confinement is high. Regarding the ridge structure part 140, width of an upper part where a contact layer containing a light absorption layer is arranged is wide, that is, the ridge structure part 140 is T-shaped. According to the above mentioned structure, photo detecting amount which is received by the photodetector section 3 can be sufficiently secured.

Embodiment 3

Figure 8:
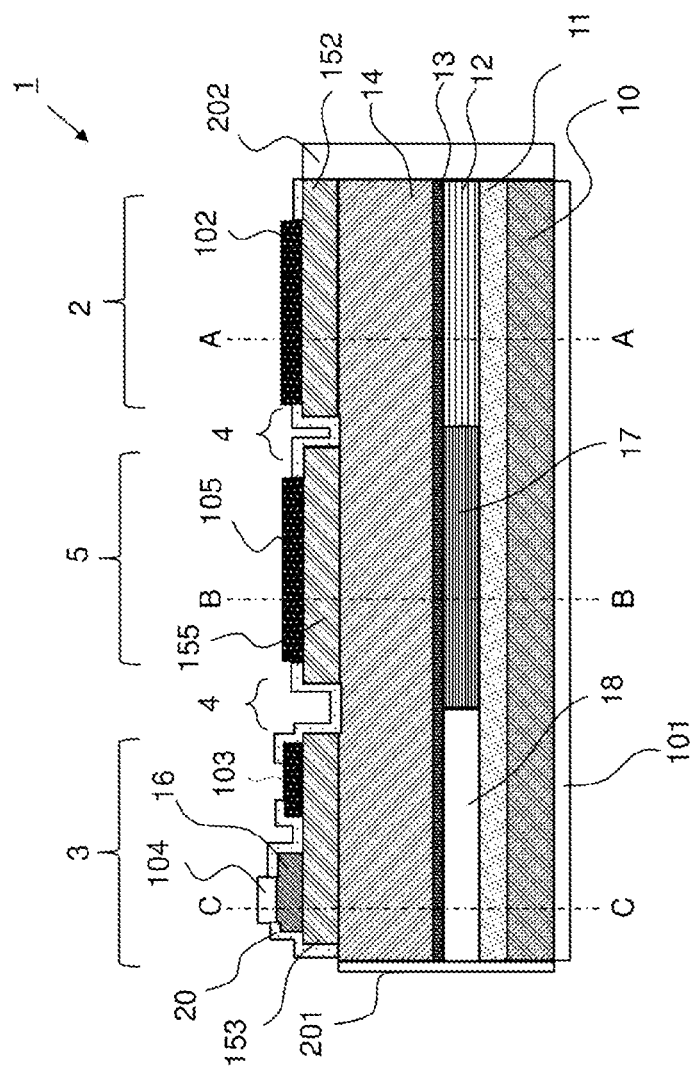
FIG. 8 is a cross section in a waveguide center showing the structure of an optical semiconductor integrated element according to Embodiment 3.
Figure 9:
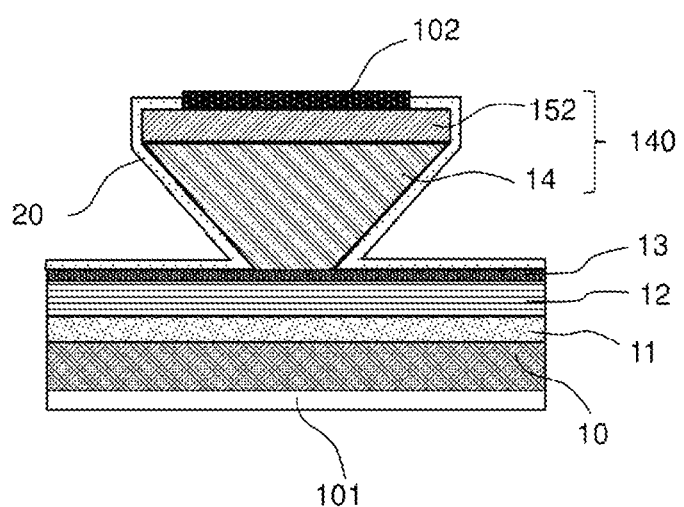
FIG. 9 is a cross section taken on line A-A of FIG. 8 of an optical semiconductor integrated element according to Embodiment 3.
Figure 10:
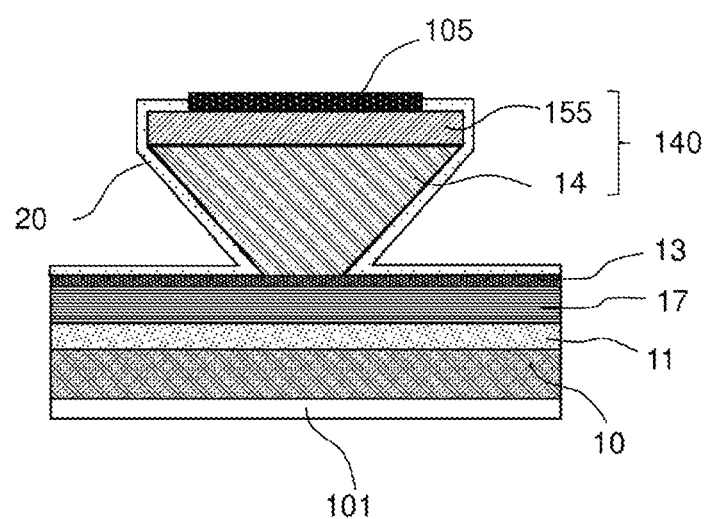
FIG. 10 is a cross section taken on line B-B of FIG. 8 of an optical semiconductor integrated element according to Embodiment 3.
Figure 11:
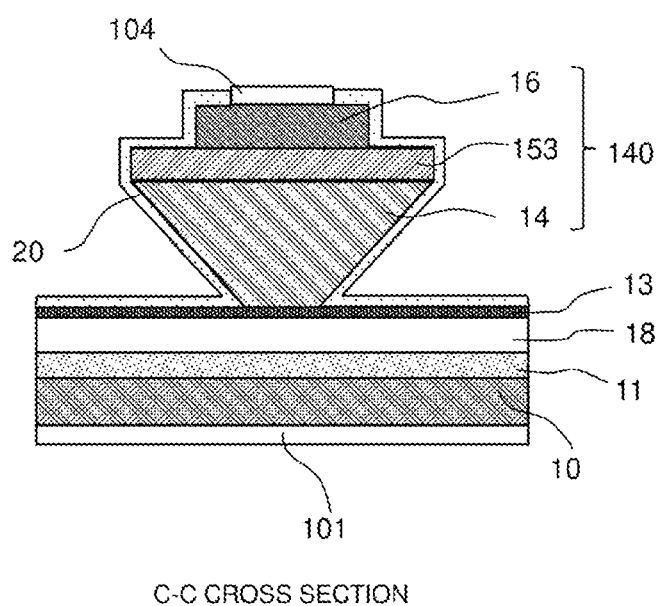
FIG. 11 is a cross section taken on line C-C of FIG. 8 of an optical semiconductor integrated element according to Embodiment 3.

FIG. 8 is a cross section showing the structure of an optical semiconductor integrated element 1 according to Embodiment 3 in a cross section in a waveguide center which is parallel to an optical axis direction which is a direction where light propagates and which is perpendicular to a semiconductor substrate 10. FIG. 9 is cross section showing a structure of an optical semiconductor integrated element according to Embodiment 3 taken on line A-A of FIG. 8, FIG. 10 is a cross section taken on line B-B of FIG. 8 and FIG. 11 is a cross section taken on line C-C of FIG. 8. The optical semiconductor integrated element 1 according to Embodiment 3 has a structure in which between a laser section 2 and a photodetector section 3, an optical modulator section 5 which constitutes an electro-absorption optical modulator (EAM) is integrated.

Regarding the optical modulator section 5, as a light confining layer which corresponds to an active layer 12 in the laser section 2, a modulator section light absorption layer 17 whose light absorption is changed with or without electric field is formed, and in the optical modulator section 5, laser light can be modulated. In the optical modulator section 5, in the same way as that of the laser section, on a p-InP cladding layer 14, a p-InGaAs contact layer 155 which is a contact layer is formed, on an upper surface of the p-InGaAs contact layer, a p-InP electrode 105 is formed. In Embodiment 3, in the photodetector section 3, a light confining layer is not an active layer but simply, is an optical waveguide layer 18. As above mentioned, in the photodetector section 3, it is not necessary for a light confining layer to be an active layer, and it may be simply an optical waveguide layer. As shown in each cross section of FIG. 9, FIG. 10 and FIG. 11, regarding the optical semiconductor integrated element 1 according to Embodiment 3, a ridge structure part 140 containing the p-InP cladding layer 14 has an inverted mesa shape. Regarding a shape of the ridge structure part 140, it may be T-shaped which is described in Embodiment 2, and any shape is acceptable when width of an upper part which is a side opposite to a side of a light confining layer such as an active layer 12, a modulator section light absorption layer 17 or an optical waveguide layer 18 is wider and width of a lower part which is a side of a light confining layer is narrower than width of an upper part.

As above mentioned, in the same as that of an optical semiconductor integrated element according to Embodiment 1 and Embodiment 2, an optical semiconductor integrated element according to Embodiment 3 as shown in FIG. 8, FIG. 9, FIG. 10 and FIG. 11 has so-called a ridge structure, and a side surface of a light confining layer and a ridge structure part 140 are not embedded with an embedded layer. Consequently, a contact layer does not contain a crystal defect which is caused by an embedded layer, therefore, the p-InGaAs layer 153 which is used as a light absorption layer of the photodetector section 3 which is integrated does not have a crystal defect, deterioration of photo detecting character and decline of reliability of the element can be suppressed.

Further, a side surface of a light confining layer and the ridge structure part 140 are not embedded with an embedded layer and is formed to be a ridge structure, therefore, sufficient amount of light which is received by the photodetector section 3 can be secured.

Embodiment 4

Figure 12:
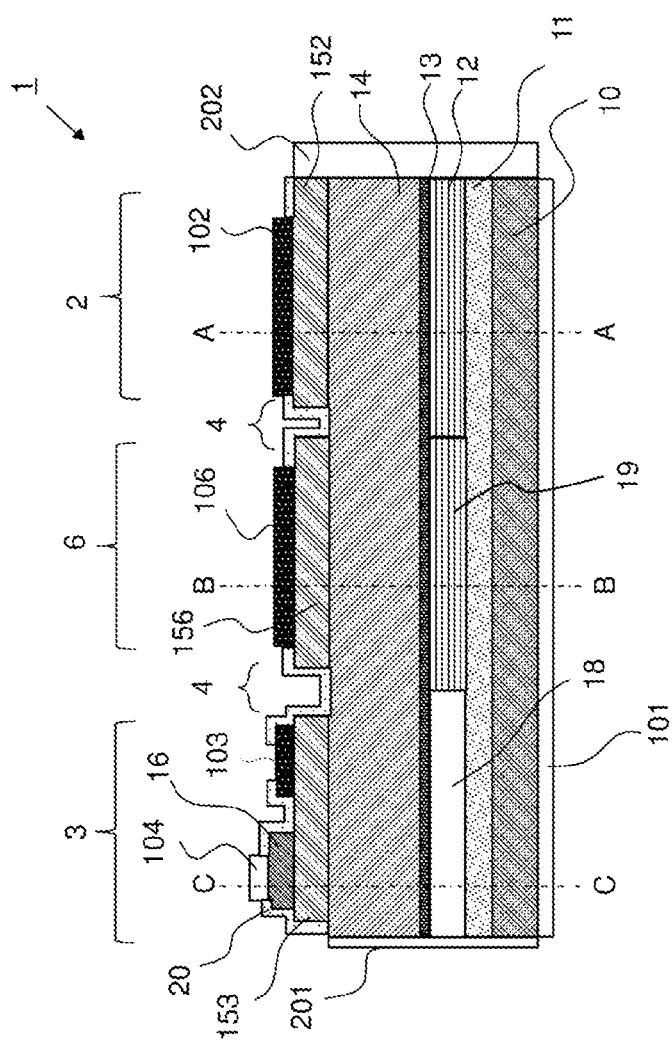
FIG. 12 is a cross section in a waveguide center showing the structure of an optical semiconductor integrated element according to Embodiment 4.

FIG. 12 is a cross section showing the structure of an optical semiconductor integrated element 1 according to Embodiment 4 in a cross section in a waveguide center which is parallel to an optical axis direction which is a direction where light propagates and which is perpendicular to a semiconductor substrate 10. The optical semiconductor integrated element 1 according to Embodiment 4 has a structure in which between a laser section 2 and a photodetector section 3, an optical amplifier section 6 which constitutes a semiconductor optical amplifier (SOA) is integrated. Regarding the optical amplifier section 6, in the same way as that of the laser section 2, a light confining layer is an active layer 19, on an active layer, a p-InP cladding layer 14 is formed, on the p-InP cladding layer 14, a p-InGaAs contact layer 156 which is a contact layer is formed and on an upper surface of the p-InGaAs contact layer 156, a p-InP electrode 106 is formed. In the optical amplifier section 6, laser light which is generated in the laser section 2 is amplified.

Figure 13:
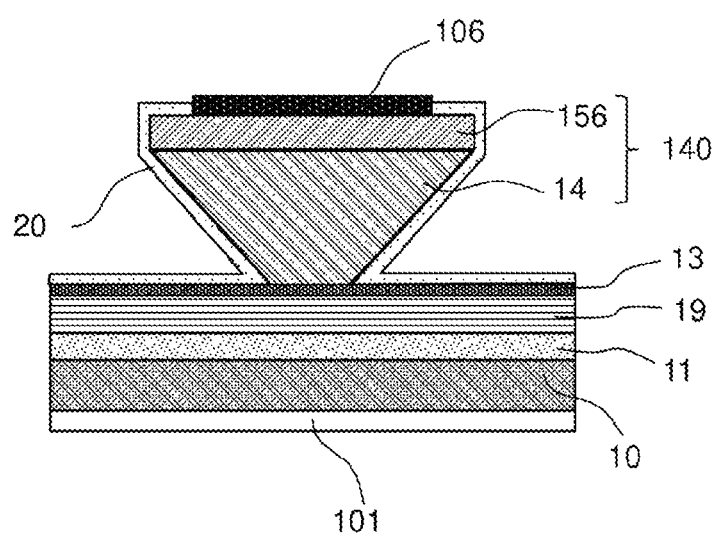
FIG. 13 is a cross section taken on line B-B of FIG. 12 of an optical semiconductor integrated element according to Embodiment 4.

FIG. 13 is a cross section taken on line B-B of FIG. 12. A cross section taken on line A-A of FIG. 12 is same as that in FIG. 2 and FIG. 9, and a cross section taken on line C-C is same as that in FIG. 11. That is, a cladding layer and a contact layer have a ridge structure and a side surface of a light confining layer and a ridge structure part 140 are not embedded with an embedded layer.

Consequently, a contact layer does not contain a crystal defect which is caused by an embedded layer, therefore, the p-InGaAs contact layer 153 which is used as a light absorption layer of the photodetector section 3 which is integrated does not have a crystal defect, therefore deterioration of photo detecting character and decline of reliability of the element can be suppressed. Further, a side surface of a light confining layer and the ridge structure part 140 are not embedded with an embedded layer so as to form a ridge structure, therefore, sufficient amount of light which is received by the photodetector section 3 can be secured.

In Embodiment 3, a structure in which between a laser section 2 and a photodetector section 3, an optical modulator is arranged, and in Embodiment 4, a structure in which between a laser section 2 and a photodetector section 3, a semiconductor optical amplifier is arranged are described, individually, however, a structure in which between a laser section 2 and a photodetector section 3, so-called spot size converter is arranged, may be acceptable.

Embodiment 5

Figure 14:
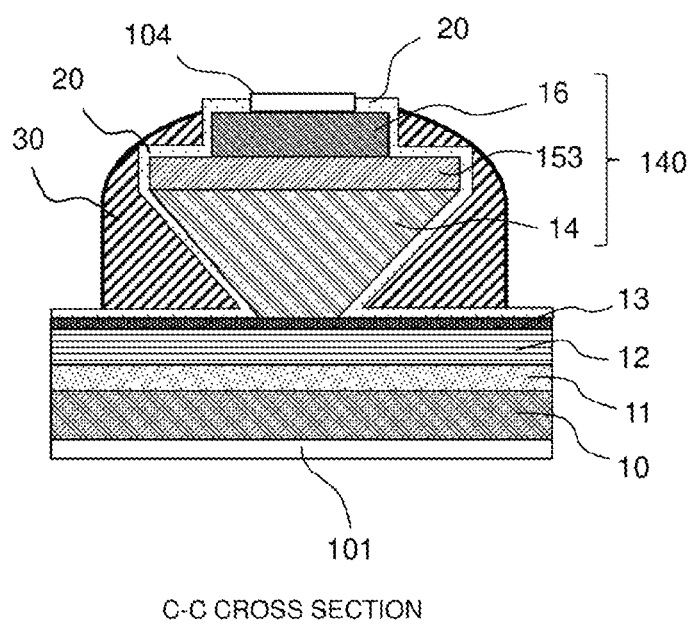
FIG. 14 is a cross section taken on line C-C of FIG. 1 of an optical semiconductor integrated element according to Embodiment 5.

A structure of an optical semiconductor integrated element according to Embodiment 5 in a cross section in a waveguide center along an optical axis is same as that in FIG. 1. FIG. 14 is a cross section which shows a structure of an optical semiconductor integrated element according to Embodiment 5 and is taken on line C-C of FIG. 1. An optical semiconductor integrated element according to Embodiment 5 has a structure in which a side surface of a ridge structure 140 of a photodetector section 3 is covered with a metal 30 such as a gold plate which reflects laser light.

The optical semiconductor integrated element according to Embodiment 5 has a structure in which the ridge structure part 140 of the photodetector section 3 is covered with a material which reflects laser light, therefore, in comparison with a case in which a ridge structure part of photodetector section is not covered with a material which reflects laser light, an amount of receiving light is increased. Therefore, output of monitor is increased and monitoring of optical output will be easier.

Embodiment 6

Figure 15:
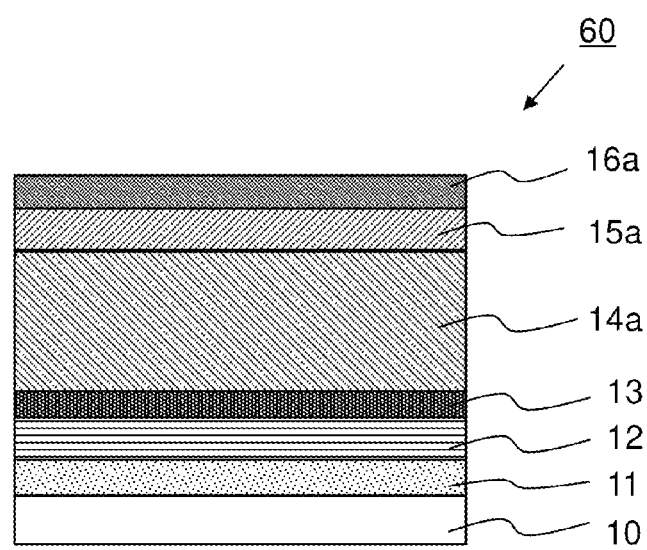
FIG. 15 is a first figure for describing a method of manufacturing an optical semiconductor integrated element according to Embodiment 6.

In Embodiment 6, a method of manufacturing an optical semiconductor integrated element shown in FIG. 1 will be described referring FIG. 15 to FIG. 24. First, as shown in FIG. 15, on an n-InP semiconductor substrate 10, an n-InP buffer layer 11, an active layer 12 (light confining layer) and an etching stopper layer 13 are grown. In the active layer 12 which is a part of a light emitting element, a diffraction grating structure which is necessary for DFB laser operation is formed. Alternatively, in a case where a diffraction grating structure is not contained in the active layer 12, a diffraction grating structure can be made partially using the etching stopper layer 13. Further, on the etching stopper layer 13, a p-InP cladding layer 14, p-InGaAs contact layers 152 and 153 which are used as a contact layer, and a cladding basic layer 14a, a contact basic layer 15a and a photodetector section contact basic layer 16a which are original substance of an n-InP contact layer 16 (photodetector section contact layer) are grown. A p-InGaAsP, which is an intermediate composition, may be formed between the cladding basic layer 14a and the contact basic layer 15a. Crystal growth is performed on the n-InP semiconductor substrate by MOCV. The contact basic layer 15a is a p-InGaAs contact layer 152 which is a contact layer of a laser section and a p-InGaAs contact layer 153 which is a light absorption layer in a photodetector section, and the p-InGaAs contact layer 152 and the p-InGaAs contact layer 153 are grown on the cladding basic layer 14a which has excellent flatness, therefore, the contact basic layer 15a has excellent crystalline and has quality which will not cause problems regarding characteristic and reliability. Here, a stacking body, shown in FIG. 15, which is formed by forming each layer by performing crystal growth by MOCVD will be referred as a basic stacking body 60. A process for forming the basic stacking body 60 will be referred as a basic stacking body forming process.

Figure 16:
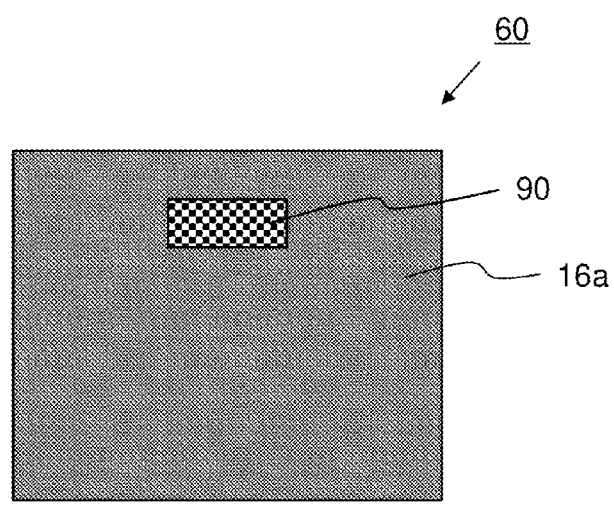
FIG. 16 is a second figure for describing a method of manufacturing an optical semiconductor integrated element according to Embodiment 6.
Figure 17:
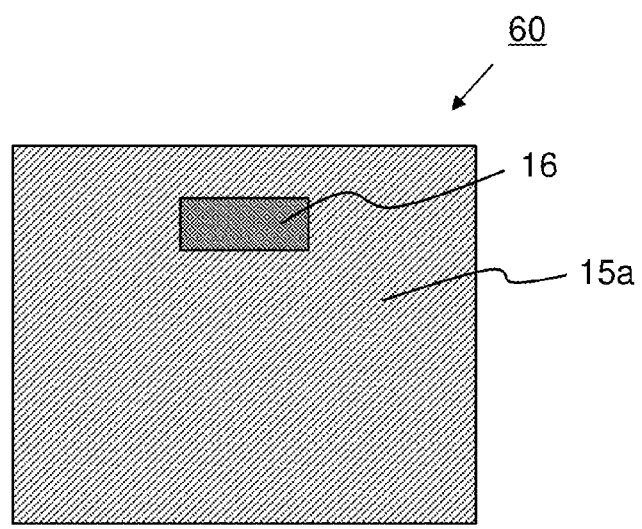
FIG. 17 is a third figure for describing a method of manufacturing an optical semiconductor integrated element according to Embodiment 6.
Figure 18:
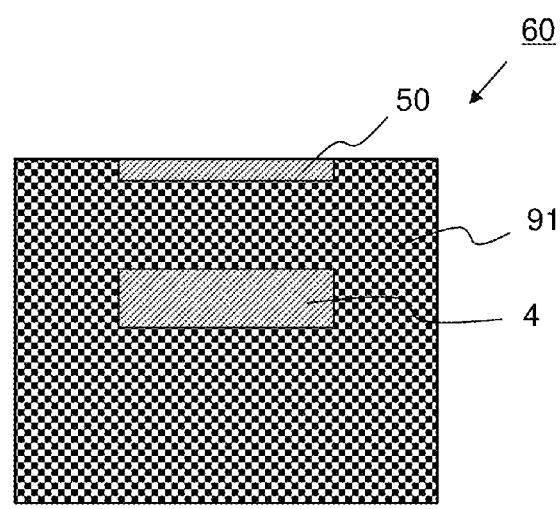
FIG. 18 is a fourth figure for describing a method of manufacturing an optical semiconductor integrated element according to Embodiment 6.

Next, as shown in FIG. 16 which is a top view, at a position to be a photodetector section on a surface of the basic stacking body 60, an insulating film mask (a first insulating film mask) 90 such as SiN, SiO$_2$, etc., is formed, a part of the photodetector section contact basic layer 16a which is an n-InP layer, where it is not necessary to form a photodetector, is removed by selectively wet etching, consequently, the basic stacking body 60 having the state shown in FIG. 17 in which a photodetector section contact layer 16 of n-InP is formed on the contact basic layer 15a which is a p-InGaAs layer (photodetector section contact layer forming process). Next, as shown in FIG. 18, in order to form an electric isolation part 4 between a photodetector section and a laser section, a surface of the basic stacking body 60 having the state shown in FIG. 17 is covered with an insulating film mask 91 (second insulating film mask) which has an opening part at a part which will be the electric isolation part 4, a contact layer 15a which is formed between a photodetector section and a laser section is removed by selective wet etching so as to form the electric isolation part 4 (electric isolation part forming process). At this time, as shown in FIG. 18, the contact basic layer 15a which exists at an edge part 50 of photodetector section is removed. By performing the above mentioned process, a basic stacking body having the state shown in FIG. 19 can be obtained.

Figure 19:
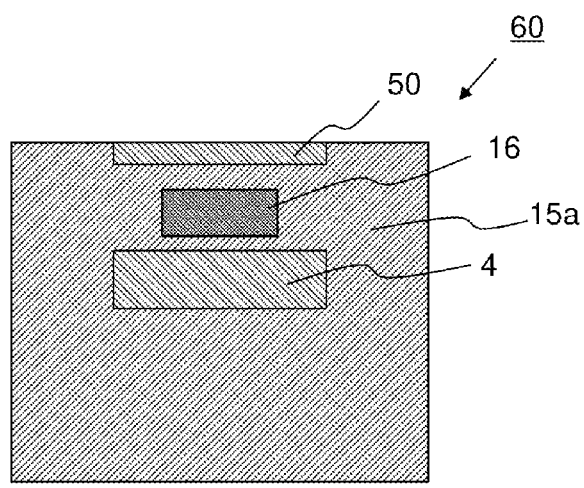
FIG. 19 is a fifth figure for describing a method of manufacturing an optical semiconductor integrated element according to Embodiment 6.
Figure 20:
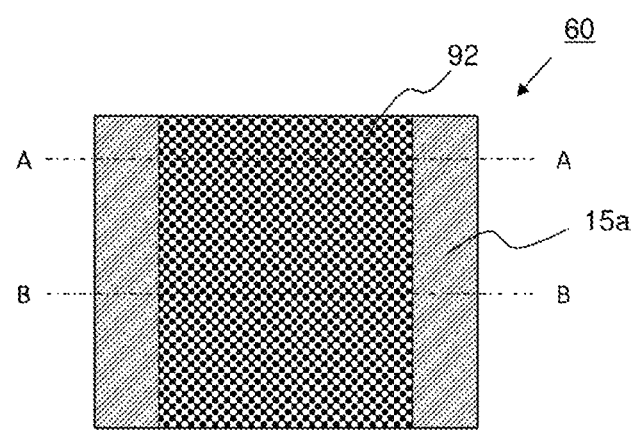
FIG. 20 is a sixth figure for describing a method of manufacturing an optical semiconductor integrated element according to Embodiment 6.
Figure 21:
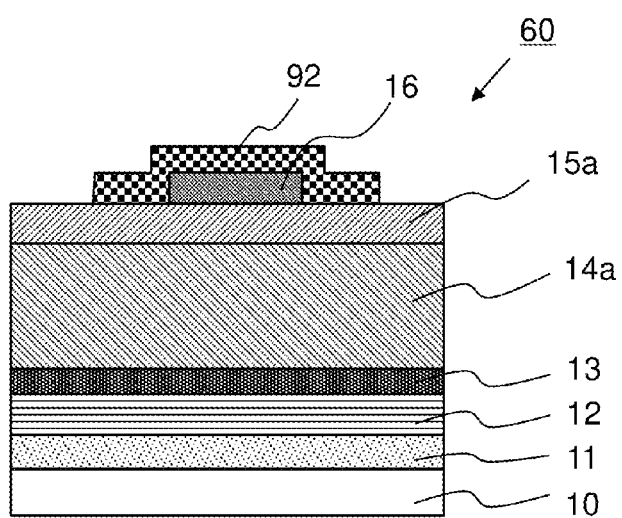
FIG. 21 is a seventh figure for describing a method of manufacturing an optical semiconductor integrated element according to Embodiment 6.
Figure 22:
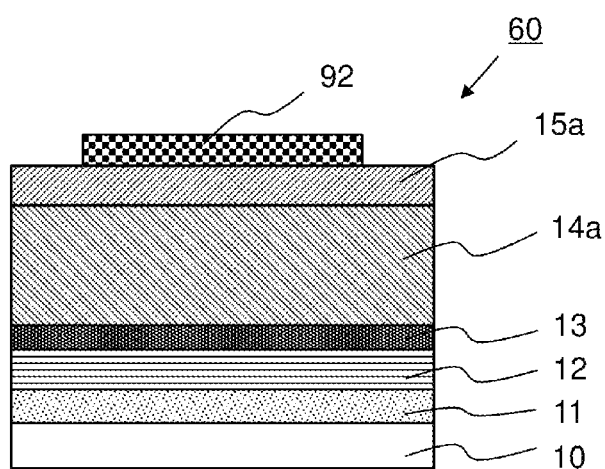
FIG. 22 is an eighth figure for describing a method of manufacturing an optical semiconductor integrated element according to Embodiment 6.
Figure 23:
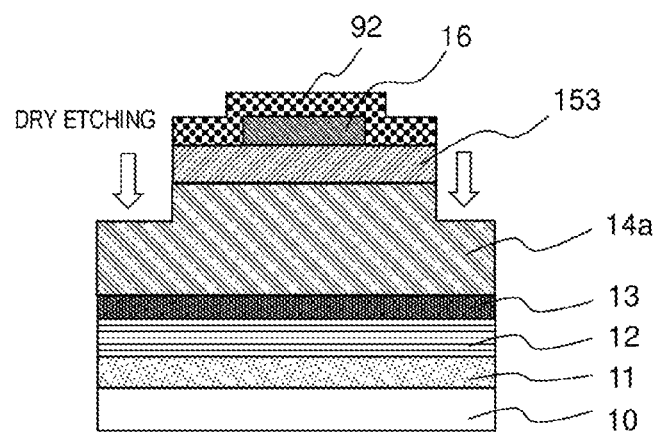
FIG. 23 is a ninth figure for describing a method of manufacturing an optical semiconductor integrated element according to Embodiment 6.
Figure 24:
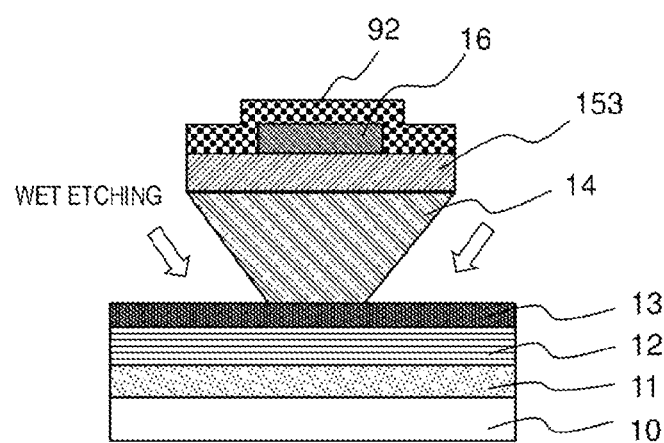
FIG. 24 is a tenth figure for describing a method of manufacturing an optical semiconductor integrated element according to Embodiment 6.

Next, as shown in FIG. 20, on a surface of the basic stacking body 60 having the state shown in FIG. 19 which is after the electric isolation part forming process is performed, an insulating film hard mask 92 (third insulating film mask) such as SiO$_2$, etc., having maximum width of a ridge structure part is formed. FIG. 21 is a cross section taken on line A-A of FIG. 20, that is, a cross section of a photodetector section, and FIG. 22 is a cross section taken on line B-B of FIG. 20, that is, a cross section of a laser section. By using the insulating film hard mask 92 (third insulating film mask), a ridge structure part is formed by etching. FIG. 23 and FIG. 24 are cross sections showing the state of etching in a photodetector section by using the insulating film hard mask 92. First, as shown in FIG. 23, by performing dry etching, both side surfaces of the contact basic layer 15a and the cladding basic layer 14a are removed until directly in front of an etching stopper layer 13 so as not for the etching stopper layer 13 to be exposed. After that, as shown in FIG. 24, by wet-etching the cladding basic layer 14a, a p-InP cladding layer 14 having an inverted mesa shape shown in FIG. 1 is formed. The above mentioned process will be referred as a ridge structure forming process. At this stage, only parts of the contact basic layer 15a on the p-InP cladding layer 14, which are necessary for each operation, are left as the P-InGaAs contact layer 153 of a photodetector section and the p-InGaAs contact layer 152 of a laser section. Further, between a photodetector section and a laser section, the electric isolation part 4 which is etched in order to secure electric isolation is formed, and on a surface, there are many level differences, therefore it is necessary to form an insulating film having excellent coverability.

After a ridge is formed, an insulating film such as SiO$_2$, SiN, etc., is formed so as to cover an exposed surface including a side surface of a cladding layer and a contact layer (an insulating film forming process). After the insulating film is formed on a surface, a part of the insulating film where an electrode is formed is removed, an n-side electrode 104 of a photodetector and p-side electrodes 102 and 103 of a photodetector and a light emitting element are formed by forming a metal film and etching. After that, on the n-InP semiconductor substrate, an electrode 101 at a n-side of a light emitting element is formed and after performing chip cutting, a reflecting coating film 201 and 202 are formed.

By performing the above mentioned manufacturing process, an optical semiconductor integrated element shown in FIG. 1 to FIG. 4 is manufactured. That is, a structure, in which at a side surface of a light confining layer, a cladding layer and a contact layer, an embedded layer of semiconductor material is not formed, can be obtained, and, an optical semiconductor integrated element in which a contact layer which is an InGaAs layer or an InGaAsP layer does not contain crystal defects, which are caused by an embedded layer, can be obtained. Consequently, an element, in which crystal defects do not exist in a p-InGaAs layer 153 which is a contact layer which is used as a light absorption layer 153 of a photodetector section 3 which is integrated and whose deterioration of photo detecting character and decline of reliability is suppressed, can be obtained.

In each of the above mentioned embodiments, an optical semiconductor integrated element, in which as a semiconductor substrate 10, an n-InP substrate is used, is described, however, a structure, in which a p-InP substrate is used and conductive type of each semiconductor layer is invert, may be acceptable.

In this application, various exemplary embodiments and examples are described, however, one or plural characteristics, aspects or functions are not limited to application of specific embodiment and as single, or various combinations, they can be applied to embodiments. Consequently, numerous modification examples which are not exemplified within range of technology which are disclosed by this specification are supposed. For example, a case where at least one component is modified, a case where at least one component is added or omitted, further a case where at least one component is extracted so as to combine with a component of other embodiment may be contained.

DESCRIPTION OF REFERENCE CHARACTERS 1. optical semiconductor integrated element
2. laser section
3. photodetector section
4. electric isolation part
5. optical modulator section
6. optical amplifier section
10. n-InP substrate (semiconductor substrate)
12, 19 active layer (light confining layer)
14. p-InP cladding layer (cladding layer)
14a. cladding basic layer
15a. contact basic layer
16. n-InP contact layer (photodetector section contact layer)
16a. photodetector section contact basic layer
17 modulator section light absorption layer (light confining layer)
18. optical waveguide layer (light confining layer)
20. insulating film
30. metal
140. ridge structure part
152, 153, 155, 156 p-InGaAs contact layer (contact layer)
60. basic stacking body 90. first insulating film mask
91. second insulating film mask
92. third insulating film mask

The invention claimed is:
1. An optical semiconductor integrated element comprising a laser section which constitutes a semiconductor laser and a photodetector section which constitutes a photodetector in which the laser section and the photodetector section are arranged on a same semiconductor substrate and along an optical axis of a laser of the laser section,
the laser section and the photodetector section have, in order from a side closest to the semiconductor substrate, a light confining layer which confines light, a cladding layer and a contact layer that is formed of an InGaAs layer or an InGaAsP layer, and
the light confining layer of the laser section is an active layer, the contact layer of the photodetector section is a light absorption layer, wherein
the cladding layer in a cross section which is perpendicular to the optical axis has a ridge structure in which a width at a side of the light confining layer is narrower than a width at a side of the contact layer, on a side surface of the light confining layer, the cladding layer and the contact layer, a semiconductor embedded layer is not provided,
a side surface of the cladding layer and the contact layer are covered with an insulating film,
a side surface of the ridge structure of the photodetector section is covered with a metal such that the insulating film insulates the metal from making electrical contact with the contact layer.

2. The optical semiconductor integrated element according to claim 1, wherein a shape of the ridge structure is an inverted mesa shape.

3. The optical semiconductor integrated element according to claim 1, wherein a shape of the ridge structure is T-shaped.

4. The optical semiconductor integrated element according to claim 1, wherein, an optical modulator section is arranged between the laser section and the photodetector section which constitutes an electro-absorption optical modulator,
and the optical modulator section has, in order from a side closest to the semiconductor substrate, a modulator section light absorption layer as a light confining layer which confines light, a cladding layer and a contact layer.

5. The optical semiconductor integrated element according to claim 1, wherein an optical amplifier section which constitutes a semiconductor optical amplifier is arranged between the laser section and the photodetector section,
and the optical amplifier section has, in order from a side closest to the semiconductor substrate, an active layer as a light confining layer which confines light, a cladding layer and a contact layer.

6. A method of manufacturing an optical semiconductor integrated element of claim 2, comprising:
a basic stacking body forming process in which on the semiconductor substrate, the light confining layer, a cladding basic layer which is a base of the cladding layer, a contact basic layer which is a base of the contact layer and a photodetector section contact basic layer which is a base of a photodetector section contact layer in the photodetector section are grown by crystal growth with MOCVD in order to form a basic stacking body,
a photodetector section contact layer forming process in which after a first insulating film mask is formed on a surface of the basic stacking body at a position of the photodetector section, after a part of the photodetector section contact basic layer where the first insulating film mask is not formed is removed by wet etching, the first insulating film mask is removed so as to form the photodetector section contact layer,
an electric isolation part forming process in which on a surface of the basic stacking body after the photodetector section contact layer forming process is performed is covered with a second insulating film mask so as to form an opening part at a part to be an electric isolation part between the photodetector section and the laser section, the contact basic layer at a position of the opening part is removed by wet etching and the second insulating film mask is removed so as to form the electric isolation part,
a ridge structure forming process in which after a third insulating film mask having maxim width of the ridge structure is formed on a surface of the basic stacking body after the electric isolation part forming process is performed, by dry etching the contact basic layer and the cladding basic layer at a part where the third insulating film mask is not formed are removed and by wet etching a side surface of remaining part of the cladding basic layer is etched so as to form the cladding layer having an inverted mesa shape and
an insulating film forming process in which an exposed surface including a side surface of the cladding layer and the contact layer is covered with an insulating film.

7. The optical semiconductor integrated element according to claim 2, wherein, an optical modulator section is arranged between the laser section and the photodetector section which constitutes an electro-absorption optical modulator,
and the optical modulator section has, in order from a side closest to the semiconductor substrate, a modulator section light absorption layer as a light confining layer which confines light, a cladding layer and a contact layer.

8. The optical semiconductor integrated element according to claim 3, wherein, an optical modulator section is arranged between the laser section and the photodetector section which constitutes an electro-absorption optical modulator,
and the optical modulator section has, in order from a side closest to the semiconductor substrate, a modulator section light absorption layer as a light confining layer which confines light, a cladding layer and a contact layer.

9. The optical semiconductor integrated element according to claim 2, wherein an optical amplifier section which constitutes a semiconductor optical amplifier is arranged between the laser section and the photodetector section,
and the optical amplifier section has, in order from a side closest to the semiconductor substrate, an active layer as a light confining layer which confines light, a cladding layer and a contact layer.

10. The optical semiconductor integrated element according to claim 3, wherein an optical amplifier section which constitutes a semiconductor optical amplifier is arranged between the laser section and the photodetector section,
and the optical amplifier section has, in order from a side closest to the semiconductor substrate, an active layer as a light confining layer which confines light, a cladding layer and a contact layer.

* * * * *